(12) United States Patent
Nguyen et al.

(10) Patent No.: US 6,770,923 B2
(45) Date of Patent: Aug. 3, 2004

(54) HIGH K DIELECTRIC FILM

(75) Inventors: Bich-Yen Nguyen, Austin, TX (US); Hong-Wei Zhou, Beijing (CH); Xiao-Ping Wang, Beijing (CH)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/099,794

(22) Filed: Mar. 15, 2002

(65) Prior Publication Data

US 2002/0137250 A1 Sep. 26, 2002

Related U.S. Application Data

(63) Continuation-in-part of application No. 09/811,656, filed on Mar. 20, 2001, now Pat. No. 6,541,280.

(51) Int. Cl.[7] .............................................. H01L 29/76
(52) U.S. Cl. ...................... 257/295; 257/596; 438/373; 438/3
(58) Field of Search .......................... 438/13, 573, 605, 438/688, 761; 257/344, 346, 336, 408, 411

(56) References Cited

U.S. PATENT DOCUMENTS

| | | | |
|---|---|---|---|
| 4,879,079 A | | 11/1989 | Hsieh |
| 5,262,469 A | * | 11/1993 | Osafune et al. ............. 428/373 |
| 5,403,792 A | * | 4/1995 | Kita ........................... 501/98.2 |
| 5,471,364 A | * | 11/1995 | Summerfelt et al. ........ 257/295 |
| 5,665,628 A | | 9/1997 | Summerfelt |
| 5,906,874 A | * | 5/1999 | Takahashi et al. ......... 428/64.1 |
| 5,910,880 A | | 6/1999 | DeBoer et al. |
| 5,940,698 A | | 8/1999 | Gardner et al. |
| 6,008,091 A | | 12/1999 | Gregor |
| 6,069,387 A | | 5/2000 | Gardner |
| 6,153,477 A | | 11/2000 | Gardner et al. |
| 6,203,613 B1 | | 3/2001 | Gates et al. |
| 6,255,122 B1 | * | 7/2001 | Duncombe et al. ............ 438/3 |
| 6,291,867 B1 | | 9/2001 | Wallace et al. |
| 6,432,561 B1 | * | 8/2002 | Yamazaki .................... 428/690 |
| 6,524,967 B1 | * | 2/2003 | Alluri ........................... 438/758 |
| 6,541,079 B1 | | 4/2003 | Bojarczuk |
| 2001/0032995 A1 | | 10/2001 | Maria et al. |

FOREIGN PATENT DOCUMENTS

| | | |
|---|---|---|
| WO | WO 01/40541 A1 | 6/2001 |
| WO | WO 01/54200 A1 | 7/2001 |
| WO | WO 02/01622 A2 | 1/2002 |
| WO | WO 02/09167 A2 | 1/2002 |

OTHER PUBLICATIONS

Warner et al., "High Temperature Ionic Conductivity in the Trivalent Ceramic Electrolytes: $LaAl_{11}O_{18}$ and $LaAl_{12}O_{18}N$," Solid State Ionics 92, 1996, pp. 99–101.

Cabanas et al., "$LaAlO_3$ Thin Flim Deposited on Si(100) and MgO(100) substrates," Solid State Ionics 101–103, 1997, pp. 191–195.

PCT/US03/07717 International Search Report.

Jung et al., "Electrical Characteristics of an Ultrathin (1.6 mm) TaOxNy Gate Gate Dielectric," American Institute of Physics, Applied Physics Letters, vol. 76, No. 24, pp. 3630–3631 (2000).

* cited by examiner

Primary Examiner—Dung A. Le
(74) Attorney, Agent, or Firm—James L. Clingan, Jr.; Patricia S. Goddard

(57) ABSTRACT

A dielectric layer comprises lanthanum, aluminum, nitrogen, and oxygen and is formed between two conductors or a conductor and substrate. In one embodiment, the dielectric layer is graded with among the lanthanum, nitrogen, or aluminum. An additional insulating layer may be formed between the conductor or substrate and the dielectric layer. The dielectric layer can be formed by atomic layer chemical vapor deposition, physical vapor deposition, organometallic chemical vapor deposition or pulsed laser deposition.

22 Claims, 3 Drawing Sheets

HIGH K DIELECTRIC FILM

RELATED APPLICATIONS

This application is a continuation-in-part of U.S. patent application Ser. No. 09/811,656, filed Mar. 20, 2001 now U.S. Pat. No. 6,541,280, and assigned to the assignee hereof.

FIELD OF THE INVENTION

This invention relates to devices used in and methods for making integrated circuits, and more particularly to high K dielectrics used in making integrated circuits.

BACKGROUND OF THE INVENTION

Silicon dioxide has been by far the most common and effective insulator used in making integrated circuits. This has a very high level of integrity and, in particular, is able to be made with a very low defect density. The result is that the silicon dioxide operates very effectively in having low leakage. With regard to gate dielectrics, one of the desirable features of the dielectric is that it couple the overlying gate to the underlying channel so that the channel is responsive to the stimulus applied to the gate. In this regard it is desirable for that dielectric to have a high dielectric constant commonly known as K.

Currently there is much work being done in developing high K dielectrics that have a higher dielectric constant than that of silicon oxide. There are a number of those, but one of the advantages of silicon oxide is its high band gap which results in it being a very effective insulator. Thus, many of the materials being developed for high K purposes have been found to have problems because they do not have a high enough band gap or because they are difficult to make with enough integrity to prevent current leakage through the dielectric.

One of the characteristics that is desirable for the high K dielectric is that it be amorphous. It must remain amorphous for its entire life including during manufacturing and subsequently during functional operation as part of the completed integrated circuit. Many of the high K dielectrics have sufficiently high K and sufficient integrity at time of deposition, but over subsequent processing steps and the heating that is associated with that, the result is crystallizing of these films. These films that are so crystallized are not perfectly crystallized throughout their entire length and width but have areas known as grain boundaries between the crystalline structures that are formed. These grain boundaries are areas of leakage and other problems that affect electrical performance.

An alternative to amorphous is monocrystalline films. In theory, these films can be made typically monocrystalline. There are several problems with that. One is matching the crystalline structure of the film with that of the underlying semiconductor, typically silicon, as well as during the formation process that it be in fact perfectly formed. Epitaxial layers, that is layers that are monocrystalline, are known in the industry. Silicon can be made epitaxially. These epitaxial processes generally are relatively slow compared to other deposition processes. One of the techniques by which very small films can be put down in a monocrystalline form is molecular beam epitaxy. There are problems with this approach in that it is very slow so that the throughput, the number of wafers per a period of time, is very low compared to conventional deposition processes such as CVD. Thus, molecular beam epitaxy (MBE) is generally considered not a manufacturable technology. Even with using MBE technology there is still the difficulty of insuring defect free films. In order to achieve this, pressures must be extremely low and the process is very slow. One very thin layer, by thin meaning 10 to 30 angstroms, can easily take 2 hours on an MBE machine.

In developing new high K dielectrics there is also another potential problem of having too high of a dielectric constant. If the dielectric constant is too high, there is an effect that is called fringing field effect that adversely affects the performance of the transistor. This has to do with excessive coupling between the gate and the source/drain. Thus, the materials that are being developed desirably have a range typically between 20 and 40 for the dielectric constant. This range may change somewhat as the technology develops further.

Another aspect of a desirable high K dielectric is in terms of its equivalent capacitance to that of a certain thickness of silicon oxide. Silicon oxide has been so commonly and effectively used that it has become a standard and the industry often describes certain characteristics in terms of its relationship to silicon oxide. In this case, the typical desirable silicon oxide equivalent is between 5 and 15 Angstroms but with silicon oxide of 5 to 15 angstroms it has problems with leakage, reliability and growth rate. Thus, when a film is that small there can be difficulties in manufacturing it as well as using it. The desirable coupling is to have a dielectric that has the equivalence of the thickness of 5 to 15 angstroms of silicon oxide but a greater actual thickness. The actual minimum thickness that is generally believed to be desirable is about 25 Angstroms.

Thus, there is a need for a dielectric film which has a dielectric constant within a desirable range, the ability to be made of high integrity, a thickness in a desirable range, and the ability to be made in a manufacturing process.

DESCRIPTION OF THE INVENTION

A high K dielectric film comprising lanthanum, aluminum and oxide provides an excellent high K material. It combines the advantages of having a desirable range of dielectric constant, the ability to remain amorphous at high temperatures, and provides for low leakage.

Figure 1:
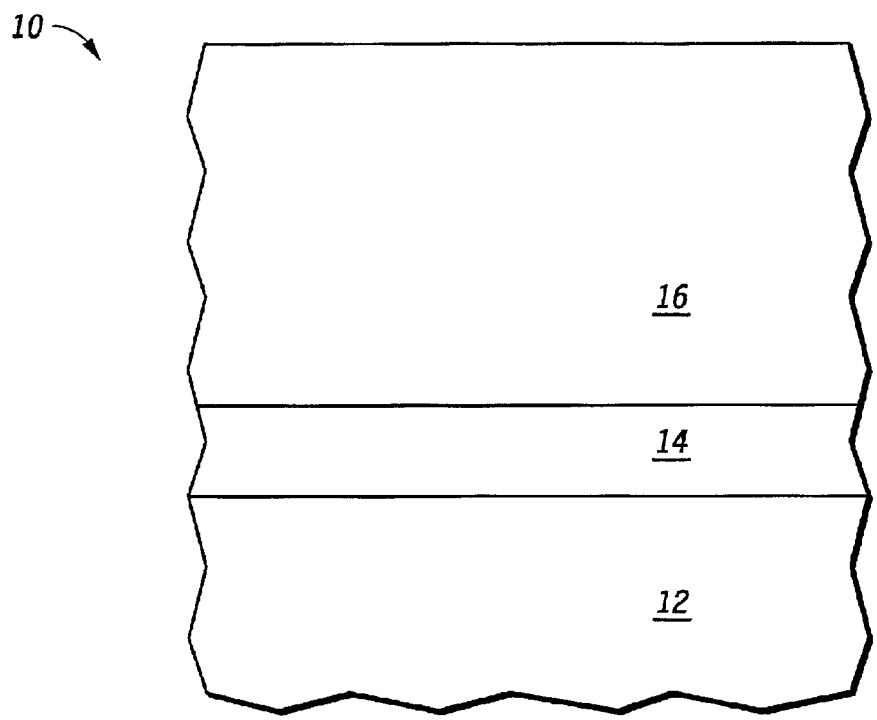
FIG. 1 is a cross section of a portion of an integrated circuit according to a first embodiment of the invention.

Shown in FIG. 1 is a portion 10 of an integrated circuit having a substrate 12 of semiconductor material, a dielectric film 14 and a conductive film 16. Substrate 12 has a semiconductor region at least at a surface thereof. The underlying portion, not shown, can either be also semiconductive material or it can be insulative material which is typical for semiconductor on insulator (SOI) substrates. Examples of semiconductive material include monocrystalline silicon, gallium arsenide, silicon germanium, and germanium. Over and on substrate 12 is dielectric layer 14.

Above and on dielectric layer 14 is conductive film 16 which functions as a gate electrode. Dielectric layer 14 operates as a gate insulator or gate dielectric. Substrate 12, as shown here at the area near the surface at the interface with dielectric film 14, is a channel of a transistor.

Gate dielectric 14 comprises lanthanum aluminate which is a compound comprising lanthanum, aluminum and oxygen. This is written as $LaAlO_3$ when the concentration of aluminum and lanthanum are the same. Gate dielectric 14 is preferably formed using atomic layer chemical vapor deposition (ALCVD). Other methods that may used include physical vapor deposition, organometallic chemical vapor deposition, and pulsed laser deposition. The ALCVD approach allows for precise control of the formation of the layer including thickness, which in this case is not less than about 25 Angstroms and preferably in the range of 30 to 90 angstroms. Gate conductor 16 in current integrated circuit technology is typically polysilicon but can be other conductors such as tungsten, Ti-nitride, tantalum nitride, or any conductor useful as a gate conductor.

The gate dielectric 14 being deposited by ALCVD is also useful in ensuring that the film is deposited in an amorphous condition. Using current ALCVD technology, a representative temperature range is 200–400 degrees and the pressures are between 0.1 and 10 torr with 1.0 torr being a common choice for ALCVDs. The temperature and pressure are chosen to ensure an amorphous state for gate dielectric 14. In the ALCVD process the aluminum and the lanthanum and the oxygen sources are introduced at different portions of a cycle. Each material has its own point in the cycle where it is introduced and deposited, which occurs by result of a reaction with the existing layer, and then is evacuated, or purged. Subsequently, other material is introduced, reacted with the existing layer and removed by purge. Then the third material is introduced and reacted and purged. A complete cycle is then all three materials but in different points and time in the cycle. It can be viewed also that there would be aluminum then oxygen, lanthanum then oxygen, aluminum then oxygen, etc. Thus, every other step would be the introduction of the oxygen source. Thus in one sense each introduction of a material is a layer of deposition. In this case, each full cycle constitutes four layers of deposition, one lanthanum, one aluminum and two oxygen so that it is layer by layer in deposition but the resulting four layers would be observable as two metal oxide layers, one of aluminum/oxygen and the other as lanthanum/oxygen. These two layers thus comprise a single layer of lanthanum aluminate.

This lanthanum aluminate provides much benefit in the area of optimizing the dielectric coefficient and low leakage. Some other materials have identifiable deficiencies. For example, lanthanum oxide has a dielectric constant that is in the right range but it absorbs water. The absorption of water is very detrimental to desirable manufacturing of integrated circuits. For example, the absorption of water by lanthanum oxide results in structural integrity problems. It becomes soft which would make it unusable in forming an integrated circuit structure. Aluminum oxide, for example, has a problem of too low of a dielectric constant. The dielectric constant of aluminum oxide is somewhat higher than silicon oxide but is not sufficiently more as to make it usable for continuous scaling. So there may be some solitary process geometry for which aluminum oxide may be usable but subsequent generations, where the dimensions would become smaller, would not be workable.

Another benefit of lanthanum aluminate is that the dielectric constant can be varied based upon the extent of the lanthanum content. Thus, an optimized dielectric constant may be able to be achieved somewhere between 10 and 25. Even somewhat greater coefficients can be obtained where the lanthanum content is even greater than the aluminum content, but this may result in problems associated with water absorption.

The lanthanum aluminate advantageously remains amorphous even at temperatures up to 1,025 and perhaps even more. 1,025 degrees Celsius is a typical highest temperature for current processes. Thus, lanthanum aluminate has been found to withstand the highest temperature that will be received during processing of an integrated circuit that is made by many typical processes for the most advanced geometries and remain amorphous. The desire is for maximum processing temperatures to drop some, but maximum temperatures will likely remain fairly high because the activation of dopants in the source/drains requires a high temperature and such activation is expected to be a requirement for the foreseeable future. Maximum temperatures may drop somewhat below 1,025 degrees Celsius but will still be expected to be over 900 degrees Celsius for at least quite some time. There is no certainty, however, that significant lowering of temperatures will occur and 1,025 degrees Celsius may continue to be a valid requirement for quite some time. Thus, the amorphous lanthanum aluminate provides the desirable high K characteristics and high integrity over anticipated temperature ranges.

Another benefit of being able to deposit the effective high K dielectric film of amorphous lanthanum aluminate is that is can be very effective, not just on silicon, but also on gallium arsenide. One of the problems in effectively implementing gallium arsenide and its advantage of higher mobility is that the gate dielectrics used in gallium arsenide are very difficult to match the integrity of those of silicon, which are achieved by growing silicon oxide at high temperature. Thus, in most applications silicon has proven to be superior to gallium arsenide. Now with an effective high K dielectric deposited using ALCVD, the result is that the gate dielectric can be of high integrity whether deposited over silicon, gallium arsenide or some other semiconductor material. The result may be that gallium arsenide will become the preferred choice for most integrated circuits and not be just a niche in the semiconductor market that it is now.

Figure 2:
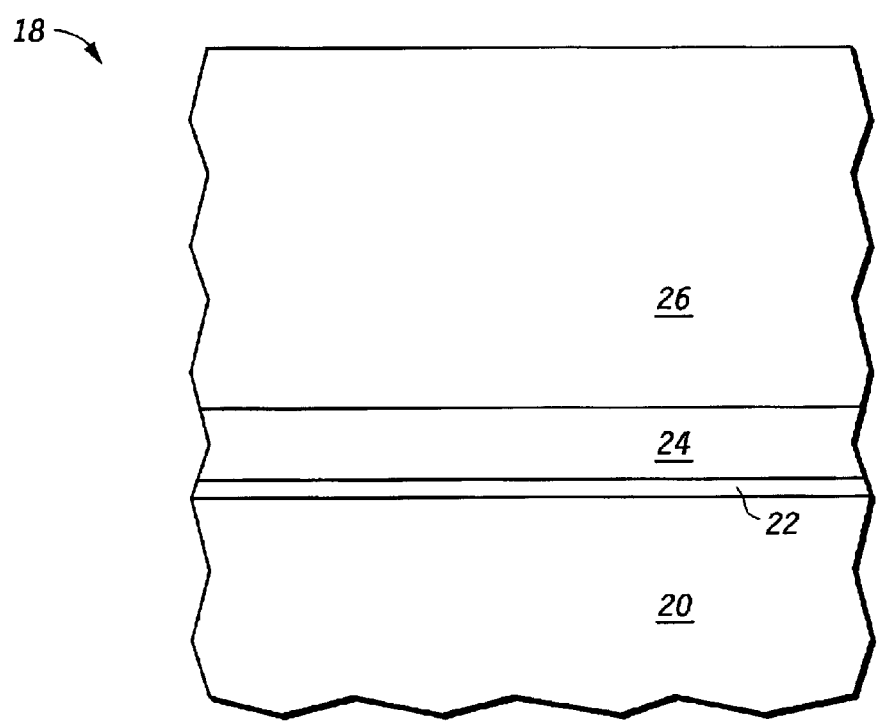
FIG. 2 is a cross section of a portion of an integrated circuit according to a second embodiment of the invention.

Shown in FIG. 2 is a portion 18 of an integrated circuit comprising a substrate 20, a barrier dielectric 22, a high K dielectric 24, and a conductor 26. In this case, high K dielectric 24 is similar or analogous to film 14 of FIG. 1 in that it is lanthanum aluminate. Conductor 26 is analogous to conductor 16 and substrate 20 is analogous to substrate 12 in FIG. 1. Barrier dielectric 22, which may also be referred to as an interfacial layer, is chosen for its desirable characteristics as an insulator. This may be, for example, aluminum oxide, silicon oxide or silicon oxynitride. Aluminum oxide is a particularly good choice for this case because it has excellent insulating characteristics and has a somewhat higher dielectric constant than silicon oxide. Barrier dielectric 22 is present to insure that the combination of high K dielectric 24 and barrier dielectric 22 have sufficient insulation characteristics to prevent unwanted current flow. For example, the combination would have a high band gap and would have a sufficiently high dielectric constant. In particular, this places a high band gap material in direct contact with the substrate 20, which is the potential source of electron injection. Another potential use for barrier dielectric 22 is as diffusion barrier if the material chosen for substrate 20 has a problem with lanthanum aluminate.

Figure 3:
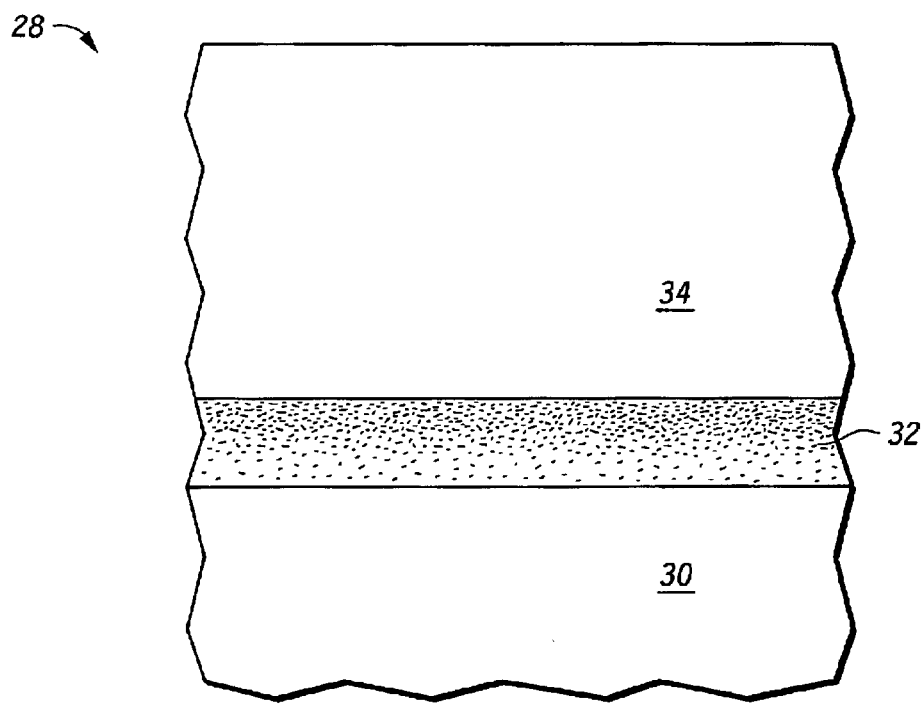
FIG. 3 is a cross section of a portion of an integrated circuit according to a third embodiment of the invention.

Shown in FIG. 3 is a portion 28 of an integrated circuit comprising a substrate 30, a dielectric film 32, and a conductor 34. In this case substrate 30 is analogous to substrates 20 and 12 and conductor 34 is analogous to conductors 26 and 16. Dielectric film 32 substitutes for dielectric 14 and for the combination of dielectrics 22 and 24. In this case dielectric film 32 has a graded concentration of lanthanum. In the dielectric film 32, near the interface with substrate 30, the material is essentially purely aluminum oxide. In moving towards conductor 34 the concentration of lanthanum continuously increases until there is a 1 to 1 ratio between aluminum and lanthanum in the dielectric film 32 near the interface and at the interface with conductor 34. The advantage of this approach is that it provides for the desirable high band gap at immediately next to substrate 30 and avoids any abrupt interfaces between the aluminum oxide and the lanthanum aluminate. The resulting dielectric constant can be adjusted as well by controlling the rate at which the concentration is increased, that is the 1 to 1 ratio between aluminum and lanthanum can be achieved well before the interface with conductor 34. An alternative is for the grading to continue past the one to one ratio so that the concentration of lanthanum exceeds the concentration of aluminum.

In the case of using ALCVD, the initial phases of deposition would not include lanthanum. The first layer would simply be aluminum and oxygen and this could continue for a desired number of layers and lanthanum could be substituted for the aluminum at an increasing rate until the 1 to 1 ratio between lanthanum and aluminum is reached. It may, in fact, be desirable to obtain a higher concentration of lanthanum than aluminum. The risk is that the quality of the film would degrade if the lanthanum became excessive whereas the benefits of the higher concentration of lanthanum in providing a higher dielectric constant may provide for a situation in which, in fact, it is desirable to have more lanthanum than aluminum. In which case, nearest the interface to conductor 34 the lanthanum would be greater than the aluminum in concentration.

Figure 4:
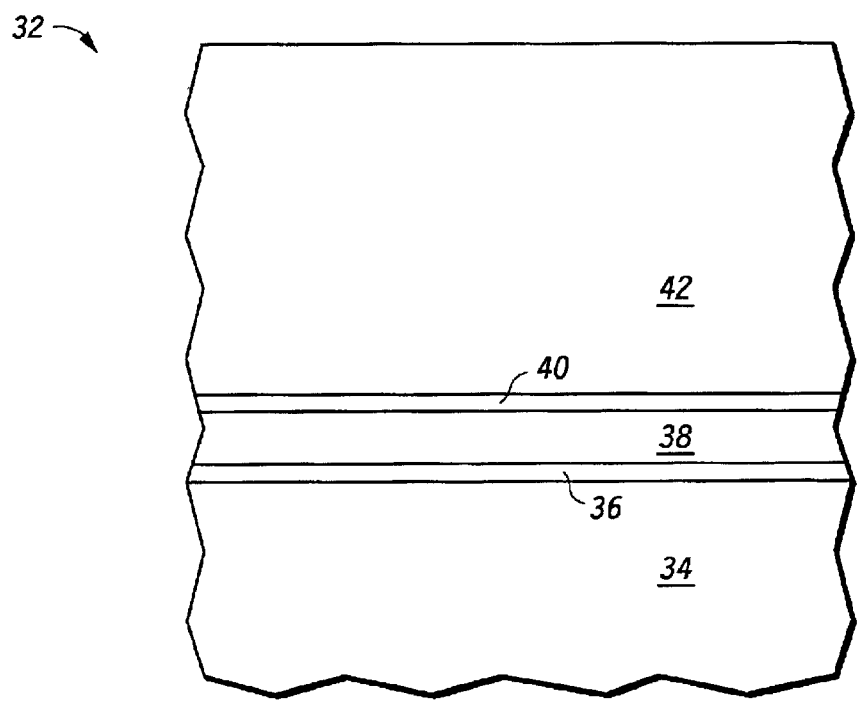
FIG. 4 is a cross section of a portion of an integrated circuit according to a fourth embodiment of the invention.

Shown in FIG. 4 is a portion 32 of an integrated circuit comprising a substrate 34, a barrier dielectric 36, a high K dielectric 38, a barrier dielectric 40 and a conductor 42. In this case, the substrate 34 is analogous to substrates 12, 20 and 30. Barrier dielectric 36 is analogous to barrier 22. High K dielectric 38 is analogous to high K dielectrics 14 and 24. Conductor 42 is analogous to conductors 16, 26 and 34. Barrier layer 40 provides a barrier between high K dielectric 38 and conductor 42. Barrier 40 is for the case in which conductor 42 has a compatibility problem with high K dielectric 38. Barrier 40 would be chosen most likely also among aluminum oxide, silicon oxide, and silicon oxynitride. The purpose of barrier dielectric 40 would be to provide a diffusion barrier between conductor 42 and high K dielectric 38. Of course, it would be desirable for barrier layer 40 to have a high dielectric constant, but its purpose is to prevent problems between conductor 42 and high K dielectric 38. A preferred choice is likely to be aluminum oxide because it has the higher dielectric constant than silicon oxide.

Figure 5:
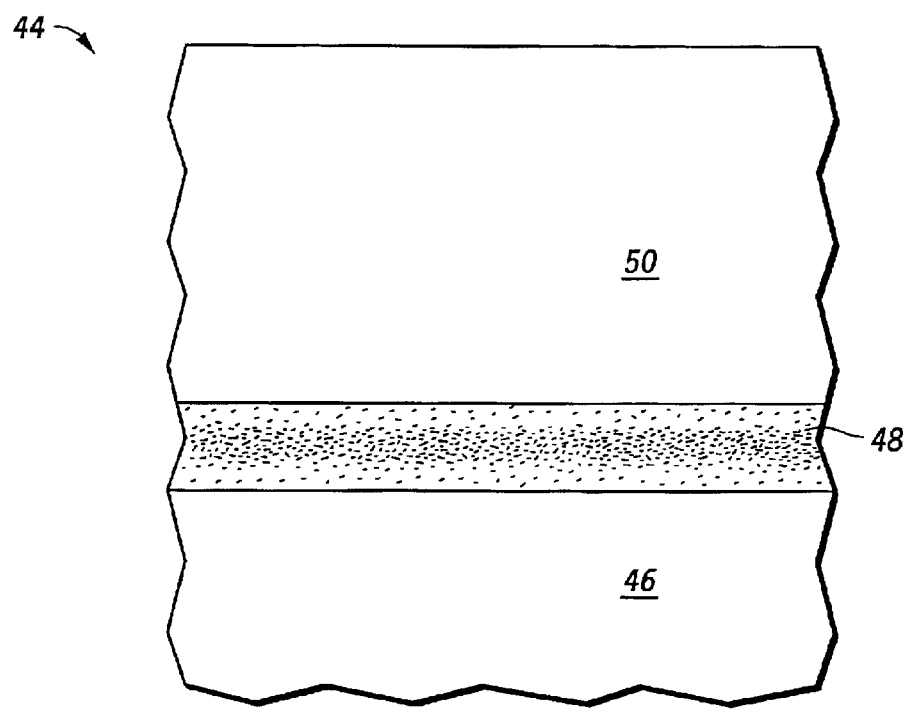
FIG. 5 is a cross section of a portion of an integrated circuit according to a fifth embodiment of the invention.

Shown in FIG. 5 is a portion 44 of an integrated circuit comprising a conductor 46, a high K dielectric 48 and a conductor 50. In this case, the applicability of the high K dielectric is between two conductors. This arises primarily in the case where conductor 46 is a floating gate for storing charge. It can also come up in situations where 46 and 50 comprise capacitor plates which are utilized for storing charge. One such example is the memory cell of a dynamic random access memory. In such a case it is also desirable for high K dielectric 48 to have a high dielectric constant as well as having the desirable characteristics of low leakage.

Shown in FIG. 5, high K dielectric 48 is lanthanum aluminate having a graded concentration. The concentration of lanthanum is maximized in the middle whereas pure or nearly pure aluminum oxide is at the interface with conductor 46 and at the interface of conductor 50. This provides for the relatively high dielectric constant and for high band gap at both the interface with conductor 46 and the interface with conductor 50 so that it is both a high K dielectric and an excellent insulator. By having high K dielectric 48 graded, the sharp interfaces between insulator types is avoided. Sharp transitions between material types tend to be places where charge can be trapped. With a graded concentration the sharp interfaces are avoided. In the case of a transistor, it is most important to have the high band gap only next to the substrate because that is where the charge is potentially injected whereas in the case of portion 44 charge can be injected from either conductor 50 or conductor 46. Thus, it is desirable to have high band gap at the interface with both conductor 50 and conductor 46.

Figure 6:
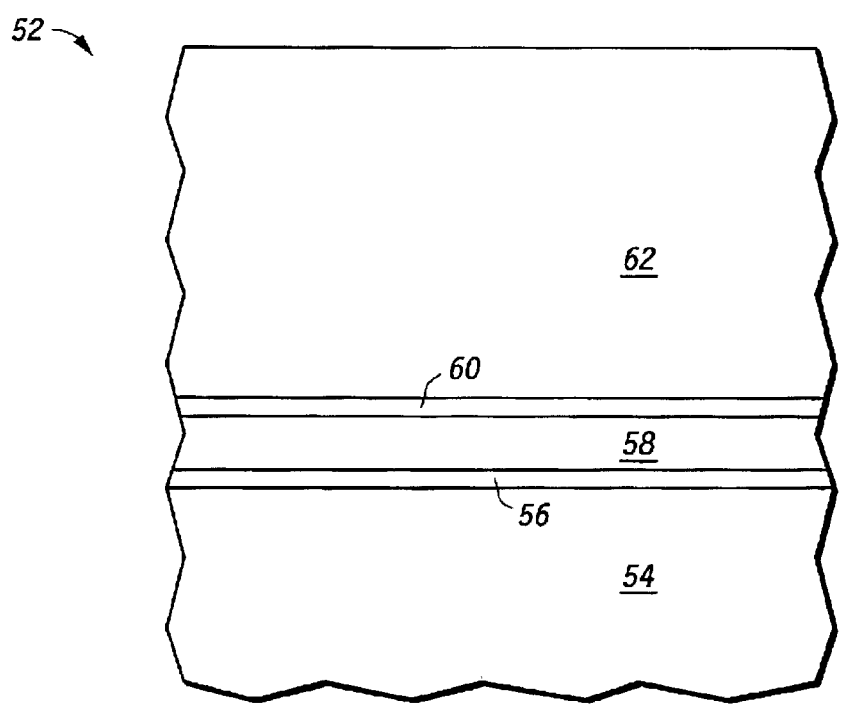
FIG. 6 is a cross section of a portion of an integrated circuit according to a sixth embodiment of the invention.

Shown in FIG. 6 is a portion 52 of an integrated circuit comprising a conductor 54, a barrier dielectric 56, a high K dielectric 58, a barrier dielectric 60 and a conductor 62. This is an analogous structure to FIG. 5. Conductor 54 is analogous to conductor 46 and conductor 62 is analogous to conductor 50 and the combination of layers 56, 58 and 60 is analogous to high K dielectric 48 in FIG. 5. In the case of FIG. 6, dielectric layers 56 and 60 operate both to provide high band gap and as a diffusion barrier between conductors 62 and 54 and high K dielectric 58. Thus, the addition of barrier layers 56 and 60 may be necessary both for sufficient insulation quality as well as providing diffusion barrier to high K dielectric 58. Conductors 54 and 62 may have different characteristics. One may be polysilicon. The other may be a metal in which case the type of barrier dielectric may be desirably different. High K dielectric 58 comprises lanthanum aluminate having the benefits described for lanthanum aluminate for film for the structures of FIGS. 1–5.

The likelihood that barriers will be required in the case of two conductors as distinct from the formation of a transistor is increased because it is, in fact, desirable for injection to occur between conductors 2 and 54 in some circumstances. Thus, the likelihood of needing barriers 56 and 60, or grading as in FIG. 5, so that such injection does not occur when it is undesirable for it to occur is more likely to be a situation that actually happens. Thus, the likelihood of needing barriers 56 and 60, or the grading shown in FIG. 5, is greater in the case where there is a storage of charge by injection. Also, in the case where it is purely acting as a capacitor, it is still more likely to need barrier layers 56 and 60. The primary purpose of a capacitor is storing charge so that the importance of having high band gap at the interface to the conductor may be more important than even for a transistor.

As an alternative for these applications for a high K dielectric, there are advantages to incorporating nitrogen in lanthanum aluminate. Similarly as for lanthanum aluminate, the concentrations of the different elements may vary and can be written as $La_wAl_xO_yN_z$ and can be considered nitrided lanthanum aluminate (NLA), and the NLA is amorphous. Thus, referring to FIG. 1, dielectric 14 may comprise NLA.

An advantage of NLA is that it is very resistant to boron penetration. Boron is generally present in at least gate polysilicon for P channel transistors. Thus for the case where dielectric 14 is a gate dielectric, which is a primary application for high K dielectrics, it is important that boron does not penetrate from conductor 16 to substrate 12. With conductor 16 being a gate electrode, the region of substrate 12 under conductor 16 will be a channel for a transistor. Boron penetrating into the channel will affect the electrical characteristics of the transistor. Such effects may be undesirable and are very unlikely to be consistent for all transistors and thus create performance variations among the transistors. The nitrogen present with the lanthanum aluminate also slightly increases the dielectric constant so the NLA is beneficial as both as a boron barrier between the gate electrode and the channel but also retains the benefits of being high K. The concentration of the nitrogen should be at least 1 percent atomic weight to achieve the beneficial boron penetration resistance, but it should not be necessary to exceed 10 percent atomic weight to achieve the desired characteristic. Another benefit of NLA is that it has high thermal and chemical stability for conventional CMOS applications.

A potential disadvantage of NLA is that nitrogen tends to trap charge so that ordinary current between the source and drain of a transistor may be sufficient for electrons to become sufficiently energized to transfer into the gate dielectric at the interface of the channel to the gate dielectric. Thus, to avoid this it may be beneficial to grade the nitrogen content in the same way as shown in FIG. 3 for the lanthanum concentration. In this example and by referring to FIG. 3, the nitrogen concentration will greatest at the interface between the gate electrode 34 and the gate dielectric 32. At this greatest concentration location, the concentration should be at least 1 percent atomic weight. At the least concentration location, the concentration should be no more than 0.5 percent nitrogen by atomic weight. The degree of change in concentration can be altered to achieve the desired boron penetration resistance while keeping the nitrogen away from the interface between the substrate 30 and the gate dielectric 32.

NLA may also be substituted for gate dielectric 24 shown in FIG. 2 or gate dielectric 38 as shown in FIG. 4, in which case barrier 40 may not be needed. With gate dielectric 38 being NLA, barrier 36 separates substrate 34 from the nitrogen present in the NLA of gate dielectric 38. The NLA of gate dielectric 38 protects substrate 34 from boron penetrating from conductor 42. In such case, the NLA-containing layer 38 would preferably be thicker than barrier 36. As a further alternative for using NLA in a structure like FIG. 1, barrier 40 could be NLA to provide boron penetration protection, dielectric 38 could be a high K dielectric, and barrier 36 could be retained. A benefit of barrier 36 being silicon oxide is that interface trap density is low and thus prevents mobility degradation. In this case latter case, the NLA-containing layer would preferably be thinner than the high K dielectric layer 38. An exemplary range for the NLA-containing layer is 10–90 Angstroms (1–9 nanometers). An exemplary range for the other layer is 5–20 Angstroms (0.5–2 nanometers).

NLA may also be substituted for lanthanum aluminate in FIGS. 5 and 6, for example, for the situation in which the dielectric may be used between a control gate and floating gate. As for the case in FIG. 5, the nitride concentration in the NLA of dielectric 48 would be greater in the middle. For FIG. 6 dielectric 58 would comprise NLA. The NLA could be used in combination with other layers such as barrier 56 and/or 60 to achieve the desired thickness for leakage protection and the desired capacitive coupling between them.

The NLA may be formed using the techniques described for the lanthanum aluminate. One of the techniques that is known in the industry for depositing lanthanum aluminate is to use Al(acac)3 [acetyl acetonate aluminum], which carries the aluminum, La(thd)3 [2,2,6,6 tetramethyl-3,5 heptanedione lanthanum], which carries the lanthanum, and oxygen in a organometallic chemical vapor deposition process (MOCVD). This is effective, but is difficult to achieve high purity levels of lanthanum aluminate due to the presence of elements other than oxygen, lanthanum, and aluminum. The ALD technique is beneficial for controlling film thickness, conformality, and composition but still may not result in the desired level of purity.

A technique that offers a higher level of purity is to use a lanthanum aluminate target with argon or laser sputtering in combination with active nitrogen and oxygen sources. The lanthanum aluminate target has a very high degree of purity and the active nitrogen can be very pure by using $N_2$ gas. The nitrogen is preferably a remote nitrogen plasma in that it is made active remotely from the plasma that is formed directly over the semiconductor wafer on which the NLA is being deposited. The material off the high purity level target is combined with the active nitrogen to form the NLA. Ammonia may also be effective as the nitrogen source even though it does have hydrogen. Hydrogen could be desorbed, however, and should not be a problem if the hydrogen content is relatively low. Other desirable nitrogen gases are nitric oxide (NO) and nitrous oxide ($N_2O$).

Another technique is to use ALD with precursors for carrying the lanthanum and aluminum that only include oxygen and nitrogen. Usable chemistries for this purpose comprise $La(NO_3)_3$ and $Al(NO_3)_3$. To start the process, $H_2O$ would be introduced, followed by a purge, to form a starting point for the deposition of the ALD. After the purge, one of either the lanthanum or aluminum nitrates, is introduced followed by a purge and then $H_2O$ again. Aluminum is preferred for the first layer closest to the silicon because it bonds better to silicon than lanthanum. This is followed by introducing a nitrogen-containing gas, such as ammonia, to achieve the desired nitrogen concentration. This is followed by a purge then $H_2O$, which is then followed by the other of the lanthanum and aluminum nitrate. This completes a complete layer of NLA. Thus, the preferred approach is that there is a monolayer having aluminum and oxygen followed by additional monolayers; one having lanthanum and oxygen, and another having nitrogen. This process is continued as desired. The step of introducing the nitrogen-containing gas can be deleted or included as desired after each of the lanthanum and aluminum nitrate steps to adjust the nitrogen concentration higher or lower.

The benefits of NLA may also be applied to additional dielectric features than a dielectric layer for use as gate dielectric or a dielectric layer between a control gate and a floating gate. For example, dielectric features such as etch stop layers, liners for sidewall spacers, and for trench liners. The function of a dielectric feature comprising nitrogen, lanthanum, nitrogen, and oxygen, such as NLA, can provide the benefit of a diffusion barrier in a variety of applications for dielectric features, such as those just listed. Further lanthanum aluminate may be used in these same applications.

While the invention has been described in various embodiments, there may be other embodiments and other materials that may be used in combination that will provide the benefit or some of the benefits that are associated with this invention. Other materials than those mentioned may be used. In addition, there may be materials that can be added to lanthanum aluminate that may provide benefits as well in addition to those provided by the lanthanum aluminate in the combinations and the various concentrations that are described. Also there may be other methods of deposition such as jet vapor deposition, remote plasma deposition, remote plasma ALD. Accordingly, it is the claims that define the scope of this invention.

What is claimed is:

1. A semiconductor structure comprising:
   a semiconductor substrate;
   a dielectric layer comprising lanthanum, aluminum, oxygen, and nitrogen over the semiconductor substrate; and
   an electrode layer over the dielectric layer.

2. The semiconductor structure of claim 1, further comprising an interfacial layer between the semiconductor substrate and the dielectric layer.

3. The semiconductor structure of claim 2 wherein the interfacial layer comprises silicon, nitrogen, and oxygen.

4. The semiconductor structure of claim 2 wherein the interfacial layer comprises aluminum, nitrogen, and oxygen.

5. The semiconductor structure of claim 1 wherein a concentration of nitrogen in the dielectric layer is higher adjacent the electrode layer as compared to adjacent the semiconductor substrate.

6. The semiconductor structure of claim 1 wherein the dielectric layer is amorphous.

7. The semiconductor structure of claim 1 wherein the semiconductor substrate is selected from a group consisting of monocrystalline silicon, gallium arsenide, semiconductor on insulator, silicon germanium, and germanium.

8. The semiconductor structure of claim 1, wherein the electrode layer is a gate electrode.

9. The semiconductor structure of claim 1 wherein at least one element of the dielectric layer is graded from zero to an amount grater than zero.

10. A semiconductor structure comprising:
    a first conductive layer;
    a dielectric layer comprising lanthanum, aluminum, oxygen, and nitrogen over the first conductive layer; and
    a second conductive layer over the dielectric layer.

11. The semiconductor structure of claim 10, wherein the first conductive layer is a floating gate.

12. The semiconductor structure of claim 10, wherein at least one of the first conductive layer and the second conductive layer is a capacitor plate.

13. The semiconductor structure of claim 10, wherein the dielectric layer has a concentration of nitrogen which is higher in a center portion of the dielectric layer as compared to portions adjacent both the first conductive layer and the second conductive layer.

14. A semiconductor structure comprising:
    a semiconductor substrate;
    a first dielectric layer formed over the semiconductor substrate;
    a second dielectric layer comprising lanthanum, aluminum, oxygen, and nitrogen formed over the first dielectric layer; and
    an electrode layer over the dielectric layer.

15. The semiconductor structure of claim 14 wherein the first dielectric layer is less than approximately 10 angstroms (1 nanometer) thick, and the second dielectric layer is between approximately 20–90 angstroms (2–9 nanometers) thick.

16. The semiconductor structure of claim 15 wherein the first dielectric comprises one of silicon oxide, oxynitride, and aluminum oxide.

17. The semiconductor structure of claim 14 wherein the first dielectric layer is between approximately 10–90 angstroms (1–9 nanometers) thick, and the second dielectric layer is between approximately 5–20 angstroms (0.5 to 2 nanometers) thick.

18. The semiconductor structure of claim 17 wherein the first dielectric layer has a dielectric constant ($K_e$) in excess of 5.

19. A semiconductor structure, comprising
    a semiconductor substrate; and
    a dielectric feature consisting of lanthanum, aluminum, nitrogen, and oxygen over the semiconductor substrate.

20. The semiconductor structure of claim 19, wherein the dielectric feature consists of nitrided lanthanum aluminate.

21. The semiconductor structure of claim 19, wherein the dielectric feature comprises one of a gate dielectric, an etch stop layer, a trench liner, and a sidewall spacer liner.

22. The semiconductor structure of claim 19, wherein the dielectric feature functions as a gate dielectric.

* * * * *